United States Patent
Park et al.

(10) Patent No.: US 11,286,403 B2
(45) Date of Patent: Mar. 29, 2022

(54) CHEMICAL MECHANICAL POLISHING COMPOSITION, CHEMICAL MECHANICAL POLISHING SLURRY AND METHOD FOR POLISHING SUBSTRATE

(71) Applicant: DONGJIN SEMICHEM CO., LTD, Incheon (KR)

(72) Inventors: Hyejung Park, Hwaseong-si (KR); Mingun Lee, Hwaseong-si (KR); Jongdai Park, Hwaseong-si (KR); Jaehyun Kim, Hwaseong-si (KR)

(73) Assignee: DONGJIN SEMICHEM CO., LTD, Incheon (KR)

( * ) Notice: Subject to any disclaimer, the term of this patent is extended or adjusted under 35 U.S.C. 154(b) by 0 days.

(21) Appl. No.: 17/260,641

(22) PCT Filed: Jul. 17, 2019

(86) PCT No.: PCT/KR2019/008849
§ 371 (c)(1),
(2) Date: Jan. 15, 2021

(87) PCT Pub. No.: WO2020/017894
PCT Pub. Date: Jan. 23, 2020

(65) Prior Publication Data
US 2021/0261825 A1  Aug. 26, 2021

(30) Foreign Application Priority Data

Jul. 20, 2018 (KR) .................. 10-2018-0084631
Jul. 16, 2019 (KR) .................. 10-2019-0085560

(51) Int. Cl.
| | | |
|---|---|---|
| C09G 1/04 | (2006.01) | |
| C09K 13/00 | (2006.01) | |
| H01L 21/306 | (2006.01) | |
| C09K 3/14 | (2006.01) | |
| B24B 37/04 | (2012.01) | |
| C09G 1/06 | (2006.01) | |
| C09G 1/00 | (2006.01) | |
| B24B 1/00 | (2006.01) | |
| C09K 13/06 | (2006.01) | |

(52) U.S. Cl.
CPC .................. *C09G 1/04* (2013.01); *B24B 1/00* (2013.01); *B24B 37/044* (2013.01); *C09G 1/00* (2013.01); *C09G 1/06* (2013.01); *C09K 3/1454* (2013.01); *C09K 3/1463* (2013.01); *C09K 13/00* (2013.01); *C09K 13/06* (2013.01); *H01L 21/30625* (2013.01)

(58) Field of Classification Search
None
See application file for complete search history.

(56) References Cited

U.S. PATENT DOCUMENTS

| | | | |
|---|---|---|---|
| 5,958,288 A | 9/1999 | Mueller et al. | |
| 5,980,775 A | 11/1999 | Grumbine et al. | |
| 6,068,787 A * | 5/2000 | Grumbine ............... | C09G 1/02 |
| | | | 252/79.1 |
| 6,068,879 A | 5/2000 | Pasch | |
| 6,162,268 A | 12/2000 | Knapp et al. | |
| 6,468,913 B1 | 10/2002 | Pasqualoni et al. | |
| 6,491,837 B1 | 12/2002 | Lui et al. | |
| 6,521,535 B2 | 2/2003 | Sabia | |
| 2003/0124852 A1 | 7/2003 | Fang et al. | |
| 2004/0072439 A1 | 4/2004 | Small et al. | |
| 2005/0211950 A1 | 9/2005 | de Rege Thesauro et al. | |
| 2005/0266689 A1 | 12/2005 | Small et al. | |
| 2009/0152240 A1 | 6/2009 | de Rege Thesauro et al. | |
| 2016/0122590 A1 | 5/2016 | Lew et al. | |
| 2016/0244639 A1 | 8/2016 | Li et al. | |
| 2018/0016467 A1* | 1/2018 | Yu ....................... | H01L 21/3212 |

FOREIGN PATENT DOCUMENTS

| | | |
|---|---|---|
| CN | 101316950 A | 12/2008 |
| CN | 101535442 A | 9/2009 |
| CN | 107743515 A | 2/2018 |
| EP | 0 845 512 A1 | 6/1998 |
| EP | 1124912 B1 | 8/2001 |
| KR | 10-1998-0042755 A | 8/1998 |
| KR | 10-1999-0063753 A | 7/1999 |
| KR | 10-2002-0056913 A | 7/2002 |
| KR | 10-2004-0059572 A | 7/2004 |
| KR | 10-2006-0134996 A | 12/2006 |
| KR | 10-2017-0078357 A | 7/2017 |
| KR | 10-2018-0080168 A | 7/2018 |
| TW | 201634656 A | 10/2016 |
| TW | 201814012 A | 4/2018 |
| WO | 98/54756 A1 | 12/1998 |

OTHER PUBLICATIONS

International Search Report and Written Opinion from PCT Application No. PCT/KR2019/008849 dated Oct. 17, 2019, all pages enclosed.

* cited by examiner

*Primary Examiner* — Jiong-Ping Lu
(74) *Attorney, Agent, or Firm* — United One Law Group LLC; Kongsik Kim; Jhongwoo Peck

(57) ABSTRACT

There are provided a chemical mechanical polishing composition, a chemical mechanical polishing slurry and a method for polishing a substrate that can realize a polishing rate equivalent to or higher than that of the existing polishing agent even if total metal content is decreased, or can realize remarkably higher polishing rate than that of the existing polishing agent when using total metal content identical as before. The chemical mechanical polishing composition comprises an iron-based metal catalyst, and a magnesium-based metal catalyst, wherein the metal content of the iron-based metal catalyst is equal to or greater than the metal content of the magnesium-based metal catalyst.

20 Claims, No Drawings

CHEMICAL MECHANICAL POLISHING COMPOSITION, CHEMICAL MECHANICAL POLISHING SLURRY AND METHOD FOR POLISHING SUBSTRATE

CROSS-REFERENCE TO RELATED APPLICATIONS

This application claims priority from PCT International Patent Application No. PCT/KR2019/008849, filed on Jul. 17, 2019, which claims priority from Korean Patent Application No. 10-2018-0084631, filed on Jul. 20, 2018, and Korean Patent Application No. 10-2019-0085560, filed on Jul. 16, 2019, the entire contents of which are incorporated herein by reference.

FIELD OF THE INVENTION

The invention relates to a chemical mechanical polishing composition, a chemical mechanical polishing slurry and a method for polishing a substrate, and specifically to a chemical mechanical polishing composition, a chemical mechanical polishing slurry and a method for polishing a substrate that are used to form a conductor consisting of tungsten when preparing semiconductor.

BACKGROUND OF THE INVENTION

In the manufacturing process of semiconductor, a polishing slurry for a conductor is applied in the process of removing a metal film, for example a tungsten film, formed on interlayer dielectric (ILC) while filling the inside of holes formed in the interlayer dielectric, to leave the tungsten film only in the holes.

Thus, most importantly, a polishing slurry for a conductor should not only minimize contamination by residual metal impurities using a small amount of catalyst metal, but also maximize a polishing rate of metal films, should have high selectivity for lower interlayer dielectric, and should not generate pattern defects such as dishing, and the like.

However, so far commercialized or developed slurries do not sufficiently meet all the requirements.

SUMMARY OF THE INVENTION

It is an object of the invention to provide a chemical mechanical polishing composition, chemical mechanical polishing slurry and a method for polishing a substrate that can realize a polishing rate equivalent to or higher than the conventional polishing agent, while decreasing total metal content.

It is another object of the invention to provide a chemical mechanical polishing composition, chemical mechanical polishing slurry and a method for polishing a substrate that can realize remarkably higher polishing rate than the conventional polishing agent when using total metal content identical as before.

It is another object of the invention to provide a chemical mechanical polishing composition, chemical mechanical polishing slurry and a method for polishing a substrate having high polishing selectivity.

It is another object of the invention to provide a chemical mechanical polishing composition, chemical mechanical polishing slurry and a method for polishing a substrate that do not generate pattern defects such as dishing.

DETAILED DESCRIPTION OF THE INVENTION

The chemical mechanical polishing composition according to the embodiments of the invention comprises an iron-based metal catalyst; and a magnesium-based metal catalyst, wherein in the total metal content of the metal catalyst mixture, the metal content of the iron-based metal catalyst may be equal to or greater than the metal content of the magnesium-based metal catalyst.

The chemical mechanical polishing slurry according to the embodiments of the invention comprises a first solution comprising multi-metallic catalysts comprising an iron-based metal catalyst and a magnesium-based metal catalyst, a polishing agent, and the remaining amount of water, and a second solution comprising an oxidant, wherein in the total metal content of the multi-metallic catalyst mixture, the metal content of the iron-based metal catalyst may be equal to or greater than the metal content of the magnesium-based metal catalyst.

The method for polishing a substrate according to the embodiments of the invention comprises the steps of: respectively providing the first solution and the second solution; mixing the first solution and the second solution before applying on a substrate; applying the chemical mechanical polishing slurry including the mixture of the first solution and the second solution on a substrate; and contacting a pad with the substrate, and moving the pad against the substrate, thereby removing at least a part of tungsten layers formed on the substrate.

Advantageous Effects

The chemical mechanical polishing composition and chemical mechanical polishing slurry according to the embodiments of the invention can realize a polishing rate equivalent to or higher than the conventional polishing agent, even if total metal content is decreased.

The chemical mechanical polishing composition and chemical mechanical polishing slurry according to the embodiments of the invention can realize remarkably higher polishing rate than the conventional chemical mechanical polishing composition and chemical mechanical polishing slurry, when using total metal content identical as before.

The chemical mechanical polishing composition and chemical mechanical polishing slurry according to the embodiments of the invention can improve polishing selectivity.

The chemical mechanical polishing composition and chemical mechanical polishing slurry according to the embodiments of the invention can conduct a semiconductor manufacturing process without generating pattern defects.

Hereinafter, embodiments of the invention will be explained in detail so that a person having ordinary knowledge in the art can easily practice them. However, the invention may be realized in different forms, and is not limited to the embodiments explained herein.

The "chemical mechanical polishing composition" and "chemical mechanical slurry" of the invention are useful for polishing, for example, multi-metal layers including integrated circuit thin films, and semiconductor thin films, and other films, surfaces and substrates for which CMP process is useful. Particularly, they are used to polish at least one metal layers related to substrates selected from the group consisting of integrated circuit, thin film, multilayered semiconductor and wafer-related silicon substrate, TFT-LCD glass substrate, GaAs substrate and other substrates, for example, a tungsten layer. Particularly, the chemical mechanical polishing composition of the invention may be used to polish one or more tungsten layers, titanium and titanium nitride layers filled in the holes of an insulation film and also formed on the insulation film, to form a conductor in the holes of the insulation film in one step.

Wherein, throughout the specification, the chemical mechanical polishing composition may mean a first solution included in the chemical mechanical polishing slurry used to polish a semiconductor substrate. And, the chemical mechanical polishing slurry may mean a composition consisting of the first solution, and a second solution comprising an oxidant. The first solution and the second solution will be described below.

Hereinafter, the invention will be explained in detail.

According to one embodiment of the invention, there is provided a chemical mechanical polishing composition comprising an iron-based metal catalyst; and a magnesium-based metal catalyst, wherein in the metal content of the metal catalyst mixture, the metal content of the iron-based metal catalyst is equal to or greater than the metal content of the magnesium-based metal catalyst.

The chemical mechanical polishing composition comprises multi-catalysts comprising an iron-based metal catalyst and a magnesium-based metal catalyst together, instead of a single catalyst component. As the result of creative efforts for finding out various catalysts capable of exhibiting synergistic effects among the existing numerous catalysts, the inventors confirmed that in case an iron-based metal catalyst and a magnesium-based metal catalyst are used together, polishing performance equivalent to or more excellent than before may be exhibited while decreasing the amount of catalysts used, and very remarkable polishing performance may be exhibited when using the same amount as before.

The iron-based metal catalyst may be selected from the group consisting of iron(II) nitrate, iron(III) nitrate, iron chloride, iron(II) sulfate, inorganic salts of iron including iron(III) sulfate, iron(II) halide, iron(III) halide (for example, fluoride, chloride, bromide and iodide), perchlorate, perbromate, and periodate, ferrosilicon, and organic iron(II) or organic iron(III) acetate, acetylacetonate, citrate, gluconate, malonate, oxalate, phthalate, succinate, or a mixture thereof. Wherein, the iron(II) nitrate and iron(III) nitrate may be in the form of hydrates as well known. For example, as the iron nitrate, iron(III) nitrate nonahydrate may be used.

According to one embodiment of the invention, the iron-based metal catalyst may be iron(II) nitrate, iron(III) nitrate, iron chloride, iron(II) sulfate, iron(III) sulfate or ferrosilicon.

The magnesium-based metal catalyst may be selected from the group consisting of magnesium nitrate, magnesium chloride, magnesium sulfate, magnesium citrate, magnesium diglutamate, magnesium formate, magnesium gluconate, magnesium glycinate, magnesium lactate, and magnesium oxalate. Wherein, the magnesium nitrate and magnesium sulfate may be in the form of hydrates as well known. For example, as the magnesium nitrate, magnesium nitrate hexahydrate may be used, and as the magnesium sulfate, magnesium sulfate hexahydrate may be used.

According to one embodiment of the invention, the magnesium-based metal catalyst may be magnesium nitrate, magnesium chloride or magnesium citrate.

Meanwhile, in the total metal content of the metal catalyst mixture, the metal content of the iron-based metal catalyst may be equal to or greater than the metal content of the magnesium-based metal catalyst.

According to one embodiment, based on the total metal content of the metal catalyst mixture, the metal content of the iron-based metal catalyst may be 1 to 20 times greater than the metal content of the magnesium-based metal catalyst.

And, in the metal catalyst mixture using the two metal catalyst in combination, on the basis of the total metal content, the minimum metal content of the magnesium-based metal catalyst may be 0.0001 wt % (1 ppm) based on the chemical mechanical polishing composition. And, on the basis of the total metal content of the metal catalyst mixture, the maximum metal content of the iron-based metal catalyst may be 0.0295 wt % (295 ppm). Wherein, in case the minimum metal content of the magnesium-based metal catalyst is less than 0.0001 wt % based on the chemical mechanical polishing composition, a polishing rate may be remarkably low. And, in case the maximum metal content of the iron-based metal catalyst is greater than 0.0295 wt %, increase in a polishing rate may slow down, and thus, it may not be economically efficient.

According to one embodiment of the invention, the total metal content of the iron-based metal catalyst and magnesium-based metal catalyst may be 0.002 wt % to 0.03 wt %, based on the chemical mechanical polishing composition. For example, the total metal content of the iron-based metal catalyst and magnesium-based metal catalyst may be 0.003 wt % to 0.03 wt %, based on the chemical mechanical polishing composition.

According to one embodiment of the invention, the maximum metal content of the iron-based metal catalyst may be 0.0295 wt % based on the chemical mechanical polishing composition, the minimum metal content of the magnesium-based metal catalyst may be 0.0001 wt % based on the chemical mechanical polishing composition, and the total metal content of the iron-based metal catalyst and magnesium-based metal catalyst may be 0.002 wt % to 0.03 wt % based on the chemical mechanical polishing composition.

Wherein, the chemical mechanical polishing composition may further comprise a dispersion stabilizer selected from tributylamine, methanesulfonic acid, or a mixture thereof.

The dispersion stabilizer may be included in the content of 0.0001 to 0.04 wt %, or 0.003 to 0.01 wt %, based on the chemical mechanical polishing composition.

In addition, the chemical mechanical polishing composition may further comprise a polishing agent. The content of the polishing agent is not specifically limited, but it may be included in the content of 0.01 to 8 wt %, based on the chemical mechanical polishing composition.

Further, the chemical mechanical polishing composition may further comprise the remaining amount of water.

The chemical mechanical polishing composition may further comprise well known additives, for example, a pH control agent, disinfectant, and the like.

The explanations about the metal catalyst are also applied to the multi-metallic catalyst included in the first solution of the following chemical mechanical polishing slurry.

Thus, according to another embodiment of the invention, there is provided a chemical mechanical polishing slurry comprising: a first solution, namely a chemical mechanical polishing composition, comprising multi-metallic catalysts comprising an iron-based metal catalyst and a magnesium-based metal catalyst; a polishing agent; and the remaining amount of water, and a second solution comprising an oxidant, wherein in the total metal content of the multi-metallic catalyst mixture, the metal content of the iron-based metal catalyst is equal to or greater than the metal content of the magnesium-based metal catalyst.

And, according to yet another embodiment of the invention, there is provided a method for polishing a substrate comprising one or more tungsten layers, comprising the steps of: respectively providing the first solution and the second solution; mixing the first solution and the second solution before applying on a substrate; applying the chemical mechanical polishing slurry including the mixture of the first solution and the second solution on a substrate; and contacting a pad with the substrate, and moving the pad against the substrate, thereby removing at least a part of the tungsten layers formed on the substrate.

Namely, the chemical mechanical polishing composition may comprise a first solution comprising multi-metallic catalysts comprising an iron-based metal catalyst and a magnesium-based metal catalyst, a polishing agent and the remaining amount of water, wherein the metal content of the iron-based metal catalyst may be equal to or greater than the metal content of the magnesium-based metal catalyst. The first solution may be stored separately from a second solution comprising an oxidant, and they may be mixed before applying on a substrate, and then, applied on the substrate. And then, by contacting a polishing pad with the substrate, and moving the pad against the substrate, at least a part of the metal layers (for example, tungsten layers) on the substrate may be removed. Meanwhile, the first solution may comprise a polishing agent. The polishing agent may be included in the content of 0.01 to 8 wt %, for example, 0.02 to 5 wt %, specifically 0.1 to 3 wt %, based on the first solution. The polishing agent is typically a metal oxide polishing agent. The metal oxide polishing agent may be selected from the group consisting of alumina, titania, zirconia, germania, silica, cerium oxide, and a mixture thereof. The polishing agent may have an average aggregate size of 10 to 150 nm. The metal oxide polishing agent is mixed with the aqueous medium of the first solution as an aqueous dispersion of metal oxide.

The first solution may further comprise a pH control agent to maximize colloidal stability in the slurry. As the pH control agent, nitric acid, hydrochloric acid, phosphoric acid, acetic acid, malonic acid, quaternary ammonium compounds, potassium hydroxide, and the like may be used. The pH control agent may be added such that the pH of the first solution may become 1 to 6, for example, 2 to 4.

The first solution may further comprise a disinfectant. The disinfectant may inhibit the growth of microorganism or remove microorganism. As the disinfectant, OMIT (chloromethylisothiazolinone), BIT (benzisothiazolinone), and the like may be used. The disinfectant may be included in the content of 0.0001 to 0.1 wt %, for example, 0.001 to 0.08 wt %, specifically 0.01 to 0.05 wt %, based on the first solution.

The first solution may further comprise a dispersion stabilizer. As the dispersion stabilizer, tributylamine, methaesulfonic acid, or a mixture thereof may be used. The dispersion stabilizer may be included in the content of 0.0001 to 0.04 wt %, for example, 0.003 to 0.01 wt %, based on the first solution.

The second solution may comprise an oxidant. As the oxidant, inorganic or organic per-compound may be used. The per-compound is a compound including one or more peroxy groups (—O—O—) or a compound including an element of the highest oxidation state. As the examples of the compound including one or more peroxy groups, although not limited hereto, hydrogen peroxide and adducts thereof, for example, urea hydrogen peroxide and percarbonate, organic peroxide, benzyl peroxide, peracetic acid, and di-t-butyl peroxide, monopersulfate ($SO_5^{2-}$)-based compounds, disulfate ($S_2O_8^{2-}$)-based compounds, and sodium peroxide may be mentioned. Specifically, the oxidant may be hydrogen peroxide. The second solution may be mixed with the first solution such that the content may become 0.1 to 5 wt %, for example, 0.5 to 3.5 wt %, specifically 1 to 2.5 wt %, based on the total content of the slurry mixed.

Hereinafter, preferable embodiments of the invention will be explained in detail through examples. However, these examples are presented only for explanation, and the scope of the invention is not limited thereto.

Comparative Examples 1 to 13 and Examples 1 to 18

Preparation of Polishing Slurry and Evaluation of Polishing

For test, a 8 inch tungsten blanket wafer, a blanket wafer on which a 8 inch PE-TEOS insulation film is formed, and a 8 inch SKW5-3 Damascene pattern wafer were used (hereinafter, referred to as a semiconductor substrate).

As a polishing apparatus, Mirra 3400 (Applied Materials, Inc.) was used, and as a polishing pad, IC-1010 (Rohm & Haas) was used, and polishing conditions were set as described in the following Table 1.

TABLE 1

| platen Rpm | head rpm | IC pressure psi | RR pressure psi | EC pressure psi | UC pressure psi | Slurry flow ml/min |
|---|---|---|---|---|---|---|
| 84 | 78 | 3.6 | 10.4 | 5.2 | 5.2 | 200 |

After polishing, the thickness of the tungsten film was measured using CMT-2000 (4 point probe, Changmin Tech Co., Ltd.), and the thickness of the insulation film was measured using Thermawave OP-2600 (KLA TENCOR), and then, a polishing rate was calculated by subtracting the thickness after CMP from the thickness before CMP. The results are shown in Tables 2 to 4.

For particle size analysis, ELS-Z (Otsuka Electronics) was used.

1) Preparation of Chemical Mechanical Polishing Slurry (Preparation of First Solution and Second Solution)

Colloidal silica was used as a polishing agent, and stirred with the catalysts of the contents described in the following Tables 2 to 6 using a stirrer, and then, pH was adjusted to a target pH using a pH control agent, thus preparing a first solution. And, before polishing the semiconductor substrate, a separately prepared second solution comprising hydrogen peroxide was mixed with the first solution to prepare a chemical mechanical polishing slurry, and then, CMP (chemical mechanical polishing) evaluation was progressed.

Specifically, in the case of Comparative Examples 1 to 6, and 8, and Examples 1 to 9 in Table 2 and Table 5, 1.3 wt % of colloidal silica having particle size of 90 nm was used together with metal catalysts, and after adding 0.03 wt % of OMIT, pH was adjusted to 3 using nitric acid and tetramethylammonium hydroxide. As the second solution, 31 wt % hydrogen peroxide solution was used, and mixed with the first solution such that the final content became 1.5 wt %. When preparing the first solution, water was used in the remaining amount. Wherein, in Comparative Example 7, a slurry comprising hydrogen peroxide only was prepared by the same method as described above, except that a metal catalyst was not used.

In the case of Comparative Examples 9 to 12 and Examples 10 to 12 in Table 3, 0.85 wt % of colloidal silica having particle size of 90 nm was used together with metal catalyst, and after adding 0.03 wt % of BIT, pH was adjusted to 2.8 using nitric acid and tetramethylammonium hydroxide. As the second solution, 31 wt % hydrogen peroxide solution was used, and mixed with the first solution such that the final content became 1.5 wt %. When preparing the first solution, water was used in the remaining amount.

In the case of Comparative Example 13 and Examples 13 to 14 in Table 4, 2.0 wt % of colloidal silica having particle size of 90 nm was used together with metal catalyst, and after adding 0.03 wt % of BIT, pH was adjusted to 2.5 using nitric acid and tetramethylammonium hydroxide. As the second solution, 31 wt % hydrogen peroxide solution was used, and mixed with the first solution such that the final content became 1.5 wt %. When preparing the first solution, water was used in the remaining amount.

In the case of Examples 15 to 17 in Table 6, 1.3 wt % of colloidal silica having particle size of 90 nm was used together with metal catalyst, and after adding 0.03 wt % of OMIT, and adding a dispersion stabilizer in the content described in Table 5, pH was adjusted to 3 using nitric acid and tetramethylammonium hydroxide. As the second solution, 31 wt % hydrogen peroxide solution was used, and mixed with the first solution such that the final content became 1.5 wt %. When preparing the first solution, water was used in the remaining amount.

2) Measurement of Polishing Rate of Tungsten Blanket Wafer

In the Table 2, iron nitrate was iron(III) nitrate nonahydrate, and magnesium nitrate was magnesium nitrate hexahydrate.

From the results of Table 2, it can be confirmed that compared to Comparative Examples 1, 5 and 6 using magnesium nitrate, iron nitrate, or ferrosilicon alone, when using an iron catalyst and a magnesium catalyst in combination as in Examples 1 to 6, higher tungsten polishing rates are exhibited despite smaller metal contents of the catalysts. Specifically, it can be seen that in the Examples wherein the metal contents of the catalysts are smaller, polishing rates are relatively higher than Comparative Examples. Thus, the Examples of the invention can realize a polishing rate equivalent to or higher than the conventional polishing agent, while decreasing total metal content.

Wherein, in case the total content of the iron catalyst and magnesium catalyst is 0.0132 wt % or less (the total content of iron metal and magnesium metal is 20 ppm or less) (Example 3), catalyst content is too small, and thus, a polishing rate is not sufficient, and in case the total content of the iron catalyst and magnesium catalyst is 0.023 wt % or more (the total content of iron metal and magnesium metal is 300 ppm or more) (Example 9), a polishing rate decreases to the contrary. And, in the case of Example 9, even if the content of Fe metal catalyst is the maximum value of 295 ppm (0.0295 wt %), the total content of Fe+Mg is 300 ppm or more, and thus, a polishing rate does not increase any longer and rather decreases, but the polishing rate is excellent. However, in the case of Comparative Example 8 wherein only an iron-based metal catalyst is used, even if the

TABLE 2

| No. | Kind and content of catalyst | Metal content | Total metal content | Tungsten polishing rate (Å/min) |
|---|---|---|---|---|
| Comparative Example 1 | iron nitrate 0.0362 wt % | Fe 50 ppm | 50 ppm | 1,113 |
| Comparative Example 2 | iron nitrate 0.2170 wt % | Fe 300 ppm | 300 ppm | 2,202 |
| Comparative Example 3 | magnesium nitrate 0.00053 wt % | Mg 0.5 ppm | 0.5 ppm | 105 |
| Comparative Example 4 | magnesium nitrate 0.0011 wt % | Mg 1 ppm | 1 ppm | 315 |
| Comparative Example 5 | magnesium nitrate 0.0844 wt % | Mg 80 ppm | 80 ppm | 991 |
| Comparative Example 6 | ferrosilicon 0.0075 wt % | Fe 50 ppm | 50 ppm | 1,380 |
| Comparative Example 7 | — | — | 0 ppm | 98 |
| Example 1 | iron nitrate 0.0145 wt % magnesium nitrate 0.0211 wt % | Fe 20 ppm Mg 20 ppm | 40 ppm | 1,816 |
| Example 2 | ferrosilicon 0.0023 wt % magnesium nitrate 0.0158 wt % | Fe 15 ppm Mg 15 ppm | 30 ppm | 1,447 |
| Example 3 | iron nitrate 0.0072 wt % magnesium nitrate 0.0032 wt % | Fe 10 ppm Mg 3 ppm | 13 ppm | 1,098 |
| Example 4 | iron nitrate 0.0109 wt % magnesium nitrate 0.0053 wt % | Fe 15 ppm Mg 5 ppm | 20 ppm | 1,228 |
| Example 5 | iron nitrate 0.0289 wt % magnesium nitrate 0.0053 wt % | Fe 40 ppm Mg 5 ppm | 45 ppm | 2,007 |
| Example 6 | iron nitrate 0.0253 wt % magnesium nitrate 0.0011 wt % | Fe 35 ppm Mg 1 ppm | 36 ppm | 1,685 |
| Example 7 | iron nitrate 0.1772 wt % magnesium nitrate 0.0369 wt % | Fe 245 ppm Mg 35 ppm | 280 ppm | 3,119 |
| Example 8 | iron nitrate 0.1809 wt % magnesium nitrate 0.0527 wt % | Fe 250 ppm Mg 50 ppm | 300 ppm | 3,335 |
| Example 9 | iron nitrate 0.2134 wt % magnesium nitrate 0.0158 wt % | Fe 295 ppm Mg 15 ppm | 310 ppm | 3,218 |
| Comparative Example 8 | iron nitrate 0.2134 wt % | Fe 295 ppm | 295 ppm | 2,411 |

Fe content becomes 295 ppm (0.0295 wt %) as in Example 9, a polishing rate is lower than Example 9. It can be seen from these results that it is preferable to use iron-based and magnesium-based metal catalysts in combination within the content range described herein.

Meanwhile, in the case of Examples 7 to 8 wherein total metal content is identical or similar as before, remarkably higher polishing rate than Comparative Example 2 can be realized. Namely, the Examples of the invention can realize remarkably higher polishing rate than before, when using the same total metal content as before.

In addition, in the case of Comparative Examples 3 and 4, the total metal catalyst content is smaller and only one kind of metal catalyst is used, and thus, a polishing rate is very inferior. Namely, in the case of Comparative Example 3, the content of the magnesium-based metal catalyst is too small (0.5 ppm, which is less than 1 ppm (0.0001 wt %)), and thus, a polishing rate is very low. In addition, the polishing rate is almost similar to the polishing rate of Comparative Example 7 wherein the slurry comprises only hydrogen peroxide without metal catalysts, and thus, improvement in the polishing rate cannot be anticipated. In the case of Comparative Example 4, the metal catalyst content is 1 ppm, and thus, a polishing rate is improved compared to Comparative Example 3, but the polishing rate is very inferior to the Examples of the invention.

TABLE 3

| No. | Kind and content of catalyst | Metal content | Total metal content | Tungsten polishing rate (Å/min) |
|---|---|---|---|---|
| Comparative Example 9 | iron chloride 0.0339 wt % | Fe 70 ppm | 70 ppm | 1,472 |
| Comparative Example 10 | iron chloride 0.0290 wt % nickel nitrate 0.0030 wt % | Fe 60 ppm Ni 6 ppm | 66 ppm | 1,308 |
| Comparative Example 11 | iron chloride 0.0290 wt % aluminum nitrate 0.0083 wt % | Fe 60 ppm Al 6 ppm | 66 ppm | 1,175 |
| Comparative Example 12 | iron chloride 0.0290 wt % calcium nitrate 0.0035 wt % | Fe 60 ppm Ca 6 ppm | 66 ppm | 998 |
| Example 10 | iron chloride 0.0290 wt % magnesium nitrate 0.0063 wt % | Fe 60 ppm Mg 6 ppm | 66 ppm | 2,388 |
| Example 11 | iron chloride 0.0290 wt % magnesium chloride 0.0024 wt % | Fe 60 ppm Mg 6 ppm | 66 ppm | 2,071 |
| Example 12 | iron chloride 0.0290 wt % magnesium citrate 0.0053 wt % | Fe 60 ppm Mg 6 ppm | 66 ppm | 2,150 |

The catalyst used in Comparative Examples 10 to 12 of Table 3 are nickel nitrate hexahydrate, aluminum nitrate nonahydrate, and potassium nitrate tetrahydrate.

As can be seen from the results of Table 3, even if multi-catalysts are used, in case multi-catalysts combining an iron-based catalyst and a nickel, aluminum, or calcium-based catalyst, different from the present disclosure, are used, tungsten polishing rate decreases to the contrary (Comparative Example 10 to 12). And, in the case of Comparative Example 9, only a single catalyst is used, and the polishing rate is higher than Comparative Example 10 to 12, but lower than Examples 10 to 12.

On the contrary, it can be confirmed that in case an iron-based catalyst and magnesium nitrate, magnesium chloride or magnesium citrate are combined, a tungsten polishing rate remarkably increases (Examples 10 to 12).

3) Polishing Rates of Tungsten Blanket Wafer and Insulation Blanket Wafer, and Measurement of Pattern Wafer Dishing

TABLE 4

| No. | Kind and content of catalyst | Content of metal | Total content of metal | Blanket Polishing rate of tungsten (Å/min) | Blanket Polishing rate of insulation film (Å/min) | Selectivity tungsten/ insulation film | Pattern Dishing (Å) 10 μm (50% density) | Pattern Dishing (Å) 1 μm (50% density) |
|---|---|---|---|---|---|---|---|---|
| Comparative Example 13 | iron nitrate 0.0362 wt % | Fe 50 ppm | 50 ppm | 1,321 | 355 | 3.7 | 780 | 533 |
| Example 13 | ferrosilicon 0.0023 wt % | Fe 15 ppm Mg 15 | 30 ppm | 1,924 | 348 | 5.5 | 596 | 399 |

TABLE 4-continued

| No. | Kind and content of catalyst | Content of metal | Total content of metal | Blanket Polishing rate of tungsten (Å/min) | Polishing rate of insulation film (Å/min) | Selectivity tungsten/insulation film | Pattern Dishing (Å) 10 μm (50% density) | Pattern Dishing (Å) 1 μm (50% density) |
|---|---|---|---|---|---|---|---|---|
| Example 14 | magnesium nitrate 0.0158 wt % iron nitrate 0.0289 wt % magnesium nitrate 0.0053 wt % | Fe 40 ppm Mg 5 ppm | 45 ppm | 2,359 | 370 | 6.4 | 492 | 358 |

In the Table 4, iron nitrate is iron(III) nitrate nonahydrate, and magnesium nitrate is magnesium nitrate hexahydrate.

From the results of Table 4, it can be confirmed that in case an iron-based catalyst and a magnesium-based catalyst are used in combination, despite smaller metal content of the catalysts, the polishing rate of tungsten increases, the polishing rate of an insulation film is maintained, and selectivity increases. In addition, from the results of polishing pattern wafer, it can be seen that dishing decreases in 1 μm (50% density), 10 μm (50% density) patterns. Thus, it can be seen that in case the polishing slurries according to Examples of the invention are used, not only polishing rate can be improved, but also pattern dishing can be decreased, compared to Comparative Examples.

4) Analysis of Residual Metal Impurities

After polishing, the wafer was cleaned with DIW (deionized water) and an ammonia solution, and dried, and then, using TXRF 3750 equipment (Rigaku Corporation), the content of metal impurities on the wafer surface after polishing was analyzed for Comparative Example 2 and Example 5. The detection limit of the equipment used was $10^8$ atoms/cm$^2$. The results were shown in Table 5.

In the Table 5, iron nitrate is iron(III) nitrate nonahydrate, and magnesium nitrate is magnesium nitrate hexahydrate.

As shown in the results of Table 5, as the result of analyzing metal impurities on the wafer surface after polishing, compared to Comparative Example 2 comprising an iron-based catalyst only, in the case of Example 8 exhibiting similar tungsten polishing rate, the amount of metal impurities remaining on the wafer surface after polishing is remarkably smaller (91% decrease).

5) Particle Size Stability Test

Using ELS-Z (Otsuka Electronics), particle size stabilities immediately after preparation, after 60 days, and after 180 days were evaluated for the chemical mechanical polishing slurries of some Comparative Examples and Examples. The results are shown in Table 6.

TABLE 5 unit: ×10$^{10}$ atoms/cm$^2$

| No. | Kind and content of catalyst | Content of metal | Total content of metal | Co | Cu | Zn | Na | Mg | Al | Cr | Mn | Fe | Ni | Mg |
|---|---|---|---|---|---|---|---|---|---|---|---|---|---|---|
| Blanket wafer | | | | N.D | 0.8 | 2.3 | N.D | N.D | N.D | 3.2 | N.D | 5.2 | 1.7 | 0.9 |
| Comparative Example 2 | iron nitrate 0.2170 wt % | Fe 300 ppm | 300 ppm | N.D | 1.7 | 2.1 | 1.5 | 0.3 | 0.1 | 3.4 | 0.8 | 196 | 2.2 | 1.3 |
| Example 5 | iron nitrate 0.0289 wt % magnesium nitrate 0.0053 wt % | Fe 40 ppm Mg 5 ppm | 45 ppm | N.D | 1.4 | 2.1 | 1.3 | 0.5 | 0.1 | 3.5 | 1.1 | 18 | 2 | 1.4 |

TABLE 6

| No. | Kind and content of catalyst | Content of metal | Total content of metal | Dispersion stabilizer | Immediately after preparation | After 60 days | After 180 days |
|---|---|---|---|---|---|---|---|
| Comparative Example 2 | iron nitrate 0.2170 wt % | Fe 300 ppm | 300 ppm | — | 97 nm | 109 nm | 135 nm |
| Example 5 | iron nitrate 0.0289 wt % magnesium nitrate 0.0053 wt % | Fe 40 ppm Mg 5 ppm | 45 ppm | — | 98 nm | 99 nm | 109 nm |
| Example 8 | iron nitrate 0.1809 wt % magnesium nitrate 0.0527 wt % | Fe 250 ppm Mg 50 ppm | 300 ppm | — | 96 nm | 104 nm | 131 nm |
| Example 15 | iron nitrate 0.1809 wt % magnesium nitrate 0.0527 wt % | Fe 250 ppm Mg 50 ppm | 300 ppm | tributylannine 0.01 wt % | 98 nm | 97 nm | 100 nm |
| Example 16 | iron nitrate 0.1809 wt % magnesium nitrate 0.0527 wt % % | Fe 250 ppm Mg 50 ppm | 300 ppm | Methanesulfonic acid 0.003 wt % | 97 nm | 100 nm | 107 nm |
| Example 17 | iron nitrate 0.1809 wt % magnesium nitrate 0.0527 wt % | Fe 250 ppm Mg 50 ppm | 300 ppm | tributulannine 0.005 wt % + methanesulfonic acid 0.001 wt % | 97 nm | 97 nm | 98 nm |

In the Table 6, iron nitrate is iron(III) nitrate nonahydrate, and magnesium nitrate is magnesium nitrate hexahydrate.

As shown in Table 6, in the case of Comparative Example 2 comprising a large quantity of iron nitrate catalyst, as time elapses, dispersion stability of colloidal silica is lowered and particle size remarkably increases.

On the contrary, in the case of Examples 5 and 8, increase in particle size is small. And, in case tributylamine or methansulfonic acid is additionally used as a dispersion stabilizer, the effect of stabilizing particle size can be further enhanced (Examples 15 to 17).

Although preferable Examples of the invention have been explained in detail, the scope of the right of the invention is not limited thereby, and many modifications and improvements by a person having ordinary knowledge in the art using the basic concept of the invention as defined in the claims are also within the scope of the right of the invention.

The invention claimed is:

1. A chemical mechanical polishing composition comprising
an iron-based metal catalyst; and
a magnesium-based metal catalyst,
wherein in the metal content of the metal catalyst mixture, the metal content of the iron-based metal catalyst is equal to or greater than the metal content of the magnesium-based metal catalyst.

2. The chemical mechanical polishing composition according to claim 1, wherein the magnesium-based metal catalyst is selected from the group consisting of magnesium nitrate, magnesium chloride, magnesium sulfate, magnesium citrate, magnesium diglutamate, magnesium formate, magnesium gluconate, magnesium glycinate, magnesium lactate, and magnesium oxalate.

3. The chemical mechanical polishing composition according to claim 2, wherein the magnesium-based metal catalyst is magnesium nitrate, magnesium chloride or magnesium citrate.

4. The chemical mechanical polishing composition according to claim 1, wherein the iron-based metal catalyst is selected from the group consisting of iron(II) nitrate, iron(III) nitrate, iron chloride, iron(II) sulfate, iron(III) sulfate, iron(II) halide, iron(III) halide, inorganic iron salts including perchlorate, perbromate and periodate, ferrosilicon, and organic iron(II) or organic iron(III) acetate, acetylacetonate, citrate, gluconate, malonate, oxalate, phthalate, succinate or a mixture thereof.

5. The chemical mechanical polishing composition according to claim 4, wherein the iron-based metal catalyst is iron(II) nitrate, iron(III) nitrate, iron chloride, iron(II) sulfate, iron(III) sulfate or ferrosilicon.

6. The chemical mechanical polishing composition according to claim 1, wherein the metal content of the iron-based metal catalyst is 1 to 20 times greater than the metal content of the magnesium-based metal catalyst.

7. The chemical mechanical polishing composition according to claim 1, wherein the metal content of the magnesium-based metal catalyst is minimum 0.0001 wt %.

8. The chemical mechanical polishing composition according to claim 7, wherein the metal content of the iron-based metal catalyst is maximum 0.0295 wt %.

9. The chemical mechanical polishing composition according to claim 1, wherein total metal content of the iron-based metal catalyst and magnesium-based metal catalyst is 0.002 wt % to 0.03 wt %.

10. The chemical mechanical polishing composition according to claim 1, further comprising a dispersion stabilizer selected from tributylamine, methanesulfonic acid, or a mixture thereof.

11. The chemical mechanical polishing composition according to claim 10, wherein the dispersion stabilizer is included in the content of 0.0001 to 0.04 wt %, based on the chemical mechanical polishing composition.

12. The chemical mechanical polishing composition according to claim 11, wherein the dispersion stabilizer is included in the content of 0.003 to 0.01 wt %, based on the chemical mechanical polishing composition.

13. A chemical mechanical polishing slurry comprising:
a first solution comprising
multi-metallic catalysts comprising an iron-based metal catalyst and a magnesium-based metal catalyst;
a polishing agent; and
the remaining amount of water, and
a second solution comprising an oxidant,
wherein in the total metal content of the multi-metallic catalyst mixture, the metal content of the iron-based metal catalyst is equal to or greater than the metal content of the magnesium-based metal catalyst.

14. The chemical mechanical polishing slurry according to claim 13, wherein the metal content of the iron-based metal catalyst is 1 to 20 times greater than the metal content of the magnesium-based metal catalyst.

15. The chemical mechanical polishing slurry according to claim 13, comprising the first solution in which the metal content of the magnesium-based metal catalyst is minimum 0.0001 wt %.

16. The chemical mechanical polishing slurry according to claim 13, comprising the first solution in which the metal content of the iron-based metal catalyst is maximum 0.0295 wt %.

17. The chemical mechanical polishing slurry according to claim 13, comprising the first solution in which the total metal content of the iron-based metal catalyst and magnesium-based metal catalyst is 0.002 wt % to 0.03 wt %.

18. The chemical mechanical polishing slurry according to claim 13, wherein the first solution further comprises a dispersion stabilizer selected from tributylamine, methanesulfonic acid, or a mixture thereof.

19. The chemical mechanical polishing slurry according to claim 18, wherein the dispersion stabilizer is included in the content of 0.0001 to 0.04 wt %, based on the first solution.

20. A method for polishing a substrate including one or more tungsten layers, comprising:
respectively providing the first solution and the second solution according to claim 13;
mixing the first solution and the second solution before applying on a substrate;
applying the chemical mechanical polishing slurry including the mixture of the first solution and the second solution on a substrate; and
contacting a pad with the substrate, and moving the pad against the substrate, thereby removing at least a part of the tungsten layers formed on the substrate.

* * * * *